(12) United States Patent
Yu

(10) Patent No.: US 12,256,525 B2
(45) Date of Patent: Mar. 18, 2025

(54) HEAT DISSIPATION AND POWER SUPPLY MODULE, AND POWER SUPPLY FRAME

(71) Applicant: SHANDONG YINGXIN COMPUTER TECHNOLOGIES CO., LTD., Shandong (CN)

(72) Inventor: Yunjie Yu, Shandong (CN)

(73) Assignee: SHANDONG YINGXIN COMPUTER TECHNOLOGIES CO., LTD., Shandong (CN)

( * ) Notice: Subject to any disclaimer, the term of this patent is extended or adjusted under 35 U.S.C. 154(b) by 31 days.

(21) Appl. No.: 18/034,547

(22) PCT Filed: Feb. 28, 2022

(86) PCT No.: PCT/CN2022/078266
§ 371 (c)(1),
(2) Date: Apr. 28, 2023

(87) PCT Pub. No.: WO2022/199329
PCT Pub. Date: Sep. 29, 2022

(65) Prior Publication Data
US 2024/0334661 A1    Oct. 3, 2024

(30) Foreign Application Priority Data
Mar. 26, 2021  (CN) .......................... 202110326006.8

(51) Int. Cl.
*H05K 7/20* (2006.01)
*H05K 7/14* (2006.01)

(52) U.S. Cl.
CPC ....... *H05K 7/20909* (2013.01); *H05K 7/1492* (2013.01); *H05K 7/20727* (2013.01)

(58) Field of Classification Search
CPC ...................... H05K 7/20909; H05K 7/20727
See application file for complete search history.

(56) References Cited

U.S. PATENT DOCUMENTS

| 10,568,238 B1 | 2/2020 | Leung et al. |
| 2002/0080564 A1* | 6/2002 | Lee .......................... H02K 7/14 361/678 |

(Continued)

FOREIGN PATENT DOCUMENTS

| CN | 2917088 Y | 6/2007 |
| CN | 101728937 A | 6/2010 |

(Continued)

OTHER PUBLICATIONS

CN-111146925-A, translation (Year: 2020).*
CN 203415926 U translation (Year: 2013).*

*Primary Examiner* — Mukundbhai G Patel
(74) *Attorney, Agent, or Firm* — IPro, PLLC

(57) ABSTRACT

The present application discloses a heat dissipating and power supply module and a power-supply shelf. The module includes: at least one fan, wherein a wind exiting side of the fan faces a power-supply shelf where the module is located; a first copper bar of a U-shaped structure and half encircling the fan; and a second copper bar electrically connected to two ends of the first copper bar, wherein the first copper bar and the second copper bar combine to form a closed loop that fully encircles the fan. The present application may maintain the power-supply shelf within the range of the normal temperatures, to improve the working stability of the power-supply shelf.

20 Claims, 2 Drawing Sheets

(56) References Cited

U.S. PATENT DOCUMENTS

| | | |
|---|---|---|
| 2004/0017653 A1 | 1/2004 | Modica |
| 2015/0236607 A1 | 8/2015 | Zhao et al. |
| 2020/0395739 A1 | 12/2020 | Santore et al. |

FOREIGN PATENT DOCUMENTS

| | | | | |
|---|---|---|---|---|
| CN | 102645957 A | | 8/2012 | |
| CN | 102799256 A | | 11/2012 | |
| CN | 202889171 U | | 4/2013 | |
| CN | 103078476 A | | 5/2013 | |
| CN | 203335445 U | | 12/2013 | |
| CN | 203415926 U | * | 1/2014 | ............... H02G 5/10 |
| CN | 104166117 A | | 11/2014 | |
| CN | 203984224 U | | 12/2014 | |
| CN | 106325434 A | | 1/2017 | |
| CN | 206412776 U | | 8/2017 | |
| CN | 107293495 A | | 10/2017 | |
| CN | 108281263 A | | 7/2018 | |
| CN | 108390375 A | | 8/2018 | |
| CN | 208782717 U | | 4/2019 | |
| CN | 111010840 A | | 4/2020 | |
| CN | 111146925 A | * | 5/2020 | ........... H05K 5/0213 |
| CN | 111615273 A | | 9/2020 | |
| CN | 111899959 A | | 11/2020 | |
| CN | 112506330 A | | 3/2021 | |
| CN | 113075980 A | | 7/2021 | |
| WO | 2017045285 A1 | | 3/2017 | |

\* cited by examiner

HEAT DISSIPATION AND POWER SUPPLY MODULE, AND POWER SUPPLY FRAME

The present application claims the priority of the Chinese patent application filed on Mar. 26, 2021 before the Chinese Patent Office with the application number of 202110326006.8 and the title of "HEAT DISSIPATION AND POWER SUPPLY MODULE, AND POWER SUPPLY FRAME", which is incorporated herein in its entirety by reference.

FIELD

The present application relates to the technical field of compatible power supply, and particularly relates to a heat dissipating and power supply module and a power-supply shelf.

BACKGROUND

In recent years, with the continuous development of the information technology, the scales of data centers are increasingly larger, and the solution for power supply of data centers has become an important issue for the data centers. The Open 19 organization is a concept that was created by LinkedIn, Hewlett Packard and so on in the year of 2016, and aims at seeking the method for creating communities, to realize commonly optimized data centers and an edge solution that improves the efficiency and the flexibility. The Open 19 proposes a method of centralized power supply to solve the problem of power supply of the cabinets of the data centers. However, such a power supply architecture has a serious risk. When a very large electric current passes through the U-shaped copper bar, an electromagnetic field is formed. However, the fan has many Hall elements, and the Hall elements are easily interfered in the electromagnetic field and thus cannot operate normally, which affects the normal operation of the fan, and finally results in an excessively high temperature of the power-supply shelf, to have a serious outcome. Particularly, the normal rotational speed of the fan is 30000 revolutions per minute. However, when the power-supply shelf is operating at the full load, the speed of the fan, as affected by the Hall effect, decreases to 91 revolutions per minute, which totally cannot normally dissipate heat.

SUMMARY

In view of the above, an object of the embodiments of the present application is to provide a heat dissipating and power supply module and a power-supply shelf, which may maintain the power-supply shelf within the range of the normal temperatures, to improve the working stability of the power-supply shelf.

In order to achieve the above object, the first aspect of the embodiments of the present application provides a heat dissipating and power supply module, and the heat dissipating and power supply module includes:

at least one fan, a wind exiting side of the fan facing a power-supply shelf where the module is located;
a first copper bar of a U-shaped structure and half encircling the fan; and
a second copper bar electrically connected to two ends of the first copper bar, the first copper bar and the second copper bar combining to form a closed loop that fully encircles the fan.

In some embodiments, the fan is a fan that does not have a Hall element.

In some embodiments, the first copper bar is electrically connected to an inputting line on one side of the U-shaped structure, and electrically connected to an outputting line on the other side of the U-shaped structure; and the second copper bar diverts an electric current that flows from one side of the U-shaped structure to the other side.

In some embodiments, the first copper bar is electrically connected to an inputting line via a transformer in a power module that converts a 220V alternating current into a 12V direct current.

In some embodiments, the first copper bar is electrically connected to an outputting line via an electronic fuse board provided at a base-board-managing-controller board.

The second aspect of the embodiments of the present application provides a power-supply shelf, and the power-supply shelf includes:

a power module, having a transformer, and the transformer being configured to convert a 220V alternating current from an inputting line into a 12V direct current;
a base-board-managing-controller board, having an electronic fuse board, and the electronic fuse board being configured to transmit the 12V direct current with current limiting to an outputting line;
at least one fan, a wind exiting side of the fan facing a power-supply shelf where the module is located;
a first copper bar of a U-shaped structure and half encircling the fan; and
a second copper bar electrically connected to two ends of the first copper bar, and the first copper bar and the second copper bar combining to form a closed loop that fully encircles the fan.

In some embodiments, the fan is a fan that does not have a Hall element.

In some embodiments, the first copper bar is electrically connected to the inputting line on one side of the U-shaped structure, and electrically connected to the outputting line on the other side of the U-shaped structure; and the second copper bar diverts an electric current that flows from one side of the U-shaped structure to the other side.

In some embodiments, the first copper bar is electrically connected to the inputting line via the transformer.

In some embodiments, the first copper bar is electrically connected to the outputting line via the electronic fuse board.

The present application has the following advantageous technical effect. The heat dissipating and power supply module and the power-supply shelf according to the embodiments of the present application, by using the technical solution in which the wind exiting side of the at least one fan faces the power-supply shelf where the module is located: the first copper bar is of a U-shaped structure and half encircles the fan; and the second copper bar is electrically connected to the two ends of the first copper bar, and the first copper bar and the second copper bar combine to form a closed loop that fully encircles the fan, may maintain the power-supply shelf within the range of the normal temperatures, to improve the working stability of the power-supply shelf.

BRIEF DESCRIPTION OF THE DRAWINGS

In order to more clearly illustrate the technical solutions of the embodiments of the present application or the related art, the figures that are required to describe the embodiments or the prior art will be briefly described below. Apparently, the figures that are described below are merely embodiments of the present application, and a person skilled in the art may obtain other figures according to these figures without paying creative work.

DETAILED DESCRIPTION

In order to make the objects, the technical solutions and the advantages of the present application clearer, the embodiments of the present application will be further described in detail with reference to the particular embodiments and the drawings.

It should be noted that all of the expressions using "first" and "second" in the embodiments of the present application are intended to distinguish two different entities or different parameters that have the same names. It can be seen that "first" and "second" are merely for the convenience of the expression, and should not be construed as a limitation on the embodiments of the present application, which will not be explained in detail in the subsequent embodiments.

Figure 1:
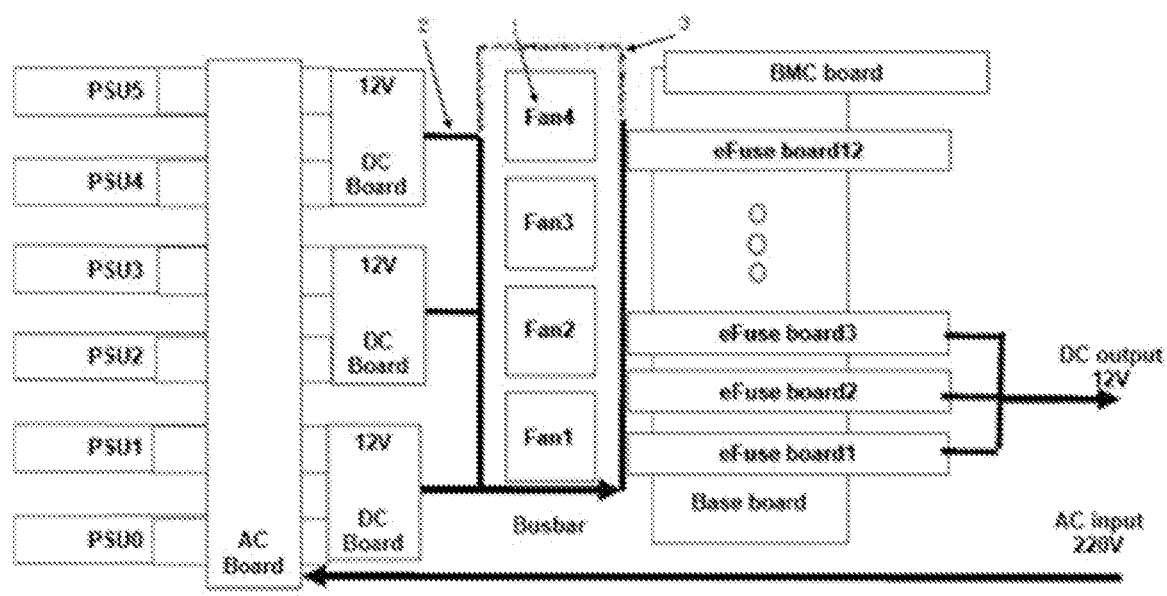
FIG. 1 is a schematic diagram of the connection relation of a heat dissipating and power supply module according to the present application.

In order to achieve the above object, the first aspect of the embodiments of the present application provides an embodiment of a heat dissipating and power supply module that maintains the power-supply shelf within the range of the normal temperatures, to improve the working stability of the power-supply shelf. FIG. 1 shows a schematic flow chart of a heat dissipating and power supply module according to the present application.

The heat dissipating and power supply module, as shown in FIG. 1, includes:
- at least one fan 1, wherein the wind exiting side of the fan faces a power-supply shelf where the module is located;
- a first copper bar 2 of a U-shaped structure and half encircling the fan 1; and
- a second copper bar 3 electrically connected to the two ends of the first copper bar 2, wherein the first copper bar 2 and the second copper bar 3 combine to form a closed loop that fully encircles the fan 1.

In some embodiments, the fan 1 is a fan that does not have a Hall element.

In some embodiments, the first copper bar 2 is electrically connected to an inputting line on one side of the U-shaped structure, and electrically connected to an outputting line on the other side of the U-shaped structure; and the second copper bar 3 diverts an electric current that flows from one side of the U-shaped structure to the other side.

In some embodiments, the first copper bar 2 is electrically connected to the inputting line via a transformer in a power module that converts a 220V alternating current into a 12V direct current.

In some embodiments, the first copper bar 2 is electrically connected to an outputting line via an electronic fuse board provided at a base-board-managing-controller board.

Figure 2:
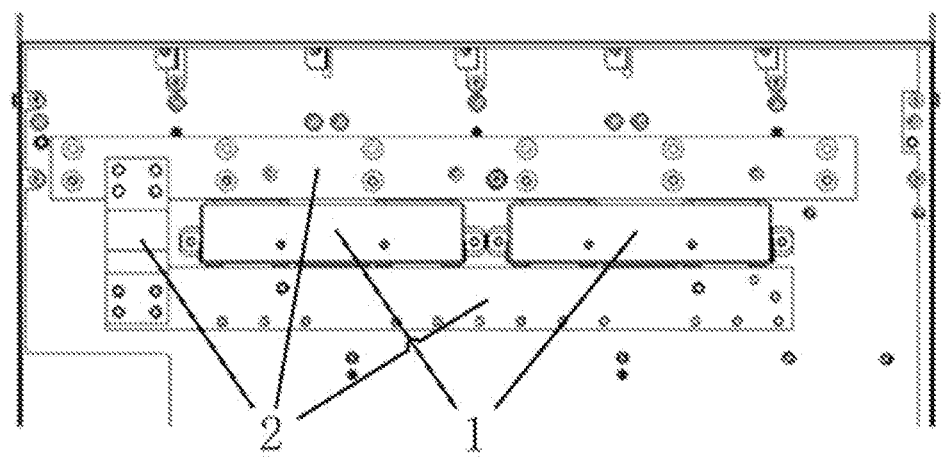
FIG. 2 is a structural diagram of the heat dissipating and power supply module according to the present application when the second copper bar does not exist.
Figure 3:
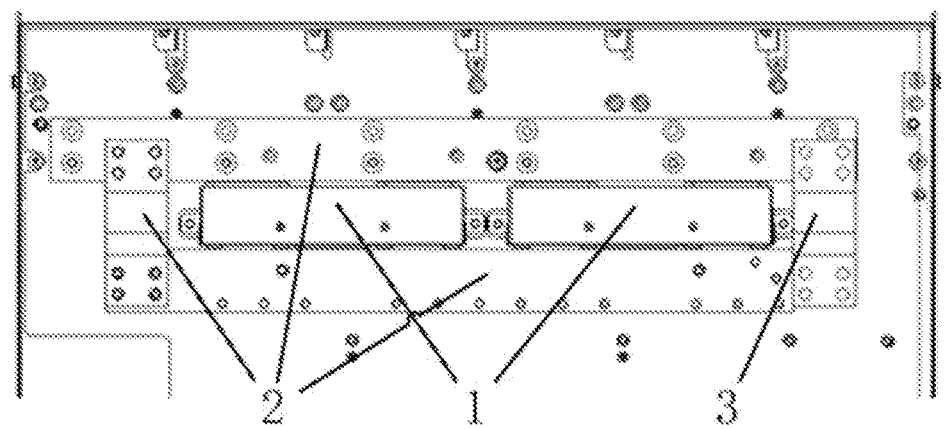
FIG. 3 is a structural diagram of the heat dissipating and power supply module according to the present application when the second copper bar exists.

Some embodiments of the present application will be further described below according to the embodiments shown in FIG. 2 and FIG. 3.

In an aspect, the embodiments of the present application are based on the Hall effect, and try to replace the original Hall-element fan module with a fan module that does not have a Hall element to the greatest extent, which may highly increase the rotational speed of the fan 1. However, the critical components of the fan 1 such as the motor are still electromagnetically driven, and therefore the fan 1 that does not have a Hall element is still inevitably affected by the Hall effect to a certain extent.

In another aspect, the embodiments of the present application aim at reducing the practical magnetic induction intensity to reduce the affection by the Hall effect. The formula for calculating the magnetic induction intensity is $B=K*I/r$, wherein B is the magnetic induction intensity, K is a constant, I is the electric current flowing through the electromagnetic field, and r is the number of windings. Therefore, the reduction of the magnetic induction intensity may be realized by reducing the electric current. In the present application, the diverting branch circuit is added to the U-shaped copper bar to form an annular closed copper bar, whereby the electric current passing through each of the sides is reduced by a half, and the magnetic induction intensity is correspondingly reduced by a half.

Particularly, according to the demand on the heat dissipation of the power-supply shelf, the suitable module of the fan 1 that does not have a Hall element is selected. In the embodiments of the present application, the DBPK0428B2SY015 fan 1 of the AVC company is selected for the solution. The fan 1, as compared with the VF40281BX-Q225-59H product of the SUNON company having a Hall element, behaves better in terms of the performances and the stability parameters. Moreover, the specification of the power-supply shelf is the electric current of 1600 A and the voltage of 12V at the full load. By comparing FIG. 2 and FIG. 3 (the cases that the second copper bar 3 does not exist and that the second copper bar 3 exists, i.e., the cases of U-shaped diverting and annular closed diverting), the magnetic fluxes detected at various positions of the fan 1 may be seen in the following table:

| Fan position | Magnetic flux of U-shaped copper bar | Magnetic flux of loop-shaped copper bar | Standard |
|---|---|---|---|
| Fan 1 | 200 mg | 100 mg | <130 mg |
| Fan 2 | 150 mg | 50 mg | <130 mg |
| Fan 3 | 100 mg | 50 mg | <130 mg |
| Fan 4 | 50 mg | 100 mg | <130 mg |

All of Fan 1 to Fan 4 are the fan 1 shown in FIG. 1. It can be seen that, after the second copper bar 3 are added, the magnetic fluxes at the positions of Fan 1 and Fan 2 are reduced below the standards, and the magnetic induction intensities corresponding to the magnetic fluxes are reduced correspondingly. In this case, the variations of the rotational speeds of Fan 1 to Fan 4 with the duty cycles are as shown in the following table:

| | Rotational speed of fan (revolutions per minute) | | | |
|---|---|---|---|---|
| Set duty cycle of fan | Fan 1 | Fan 2 | Fan 3 | Fan 4 |
| 100% | 30210 | 30303 | 30000 | 30150 |
| 90% | 27522 | 27777 | 27649 | 27777 |
| 80% | 25316 | 25641 | 25531 | 25000 |
| 70% | 22058 | 22813 | 22727 | 22388 |
| 60% | 19607 | 20202 | 19801 | 20202 |
| 50% | 16666 | 16901 | 17094 | 16901 |

-continued

Rotational speed of fan (revolutions per minute)

| Set duty cycle of fan | Fan 1 | Fan 2 | Fan 3 | Fan 4 |
|---|---|---|---|---|
| 40% | 13667 | 14051 | 13953 | 13986 |
| 30% | 10233 | 10452 | 10327 | 10434 |
| 20% | 6830 | 6976 | 6976 | 7001 |
| 10% | 3243 | 3444 | 3307 | 3351 |
| 0% | 0 | 0 | 0 | 0 |

That demonstrates that all of Fan 1 to Fan 4 may normally operate.

It can be seen from the above embodiments that the heat dissipating and power supply module according to the embodiments of the present application, by using the technical solution in which the wind exiting side of the at least one fan 1 faces the power-supply shelf where the module is located: the first copper bar 2 is of a U-shaped structure and half encircles the fan 1; and the second copper bar 3 is electrically connected to the two ends of the first copper bar 2, wherein the first copper bar 2 and the second copper bar 3 combine to form a closed loop that fully encircles the fan 1, may maintain the power-supply shelf within the range of the normal temperatures, to improve the working stability of the power-supply shelf.

It should be particularly noted that all of the steps according to the embodiments of the heat dissipating and power supply module stated above may be mutually mixed, replaced, added and deleted. Therefore, those reasonable arrangements, combinations and variations of the heat dissipating and power supply module should also fall within the protection scope of the present application, and the protection scope of the present application should not be limited to the embodiments.

In order to achieve the above object, the second aspect of the embodiments of the present application provides an embodiment of a power-supply shelf that maintains the power-supply shelf within the range of the normal temperatures, to improve the working stability of the power-supply shelf. The power-supply shelf includes:

a power module, having a transformer, wherein the transformer is configured to convert a 220V alternating current from an inputting line into a 12V direct current;

a base-board-managing-controller board, having an electronic fuse board, wherein the electronic fuse board is configured to transmit the 12V direct current with current limiting to an outputting line;

at least one fan 1, wherein the wind exiting side of the fan faces a power-supply shelf where the heat dissipating and power supply module is located;

a first copper bar 2 of a U-shaped structure and half encircling the fan 1; and a second copper bar 3 electrically connected to the two ends of the first copper bar 2, wherein the first copper bar 2 and the second copper bar 3 combine to form a closed loop that fully encircles the fan 1.

In some embodiments, the fan 1 is a fan that does not have a Hall element.

In some embodiments, the first copper bar 2 is electrically connected to the inputting line on one side of the U-shaped structure, and electrically connected to the outputting line on the other side of the U-shaped structure; and the second copper bar 3 diverts an electric current that flows from one side of the U-shaped structure to the other side.

In some embodiments, the first copper bar 2 is electrically connected to the inputting line via the transformer.

In some embodiments, the first copper bar 2 is electrically connected to the outputting line via the electronic fuse board.

It can be seen from the above embodiments that the power-supply shelf according to the embodiments of the present application, by using the technical solution in which the wind exiting side of the at least one fan 1 faces the power-supply shelf where the module is located; the first copper bar 2 is of a U-shaped structure and half encircles the fan 1; and the second copper bar 3 is electrically connected to the two ends of the first copper bar 2, wherein the first copper bar 2 and the second copper bar 3 combine to form a closed loop that fully encircles the fan 1, may maintain the power-supply shelf within the range of the normal temperatures, to improve the working stability of the power-supply shelf.

It should be particularly noted that the above embodiments of the power-supply shelf particularly describe the operating processes of the modules by using the embodiments of the heat dissipating and power supply module. A person skilled in the art may easily envisage applying those modules in other embodiments of the heat dissipating and power supply module. Certainly, because all of the modules according to the embodiments of the heat dissipating and power supply module may be mutually mixed, replaced, added and deleted, those reasonable arrangements, combinations and variations of the power-supply shelf should also fall within the protection scope of the present application, and the protection scope of the present application should not be limited to the embodiments.

A person skilled in the art should understand that the discussion on any of the above embodiments is merely illustrative, and are not intended to imply that the scope (including the claims) of the embodiments of the present application is limited to those examples. With the concept of the embodiments of the present application, the embodiments or the technical features of different embodiments may be combined, and many other variations of different aspects of the embodiments of the present application as stated above may exist, which are not provided in detail for brevity. Therefore, any omissions, modifications, equivalent substitutions and improvements that are made within the spirit and the principle of the embodiments of the present application should fall within the protection scope of the embodiments of the present application.

The invention claimed is:

1. A heat dissipating and power supply module, wherein the heat dissipating and power supply module comprises:
    at least one fan, wherein a wind exiting side of the fan faces a power-supply shelf where the heat dissipating and power supply module is located;
    a first copper bar of a U-shaped structure and half encircling the fan; and
    a second copper bar electrically connected to two ends of the first copper bar, wherein the first copper bar and the second copper bar combine to form a closed loop that fully encircles the fan.

2. The module according to claim 1, wherein the fan is a fan that does not have a Hall element.

3. The module according to claim 1, wherein the first copper bar is electrically connected to an inputting line on one side of the U-shaped structure, and electrically connected to an outputting line on the other side of the U-shaped structure; and
    the second copper bar diverts an electric current that flows from one side of the U-shaped structure to the other side.

4. The module according to claim 1, wherein the first copper bar is electrically connected to an inputting line via a transformer in a power module that converts a 220V alternating current into a 12V direct current.

5. The module according to claim 1, wherein the first copper bar is electrically connected to an outputting line via an electronic fuse board provided at a base-board-managing-controller board.

6. A power supply architecture, wherein the power supply architecture comprises the heat dissipating and power supply module according to claim 1.

7. The power supply architecture according to claim 6, wherein the fan is a fan that does not have a Hall element.

8. The power supply architecture according to claim 6, wherein the first copper bar is electrically connected to an inputting line on one side of the U-shaped structure, and electrically connected to an outputting line on the other side of the U-shaped structure; and
- the second copper bar diverts an electric current that flows from one side of the U-shaped structure to the other side.

9. The power supply architecture according to claim 6, wherein the first copper bar is electrically connected to an inputting line via a transformer in a power module that converts a 220V alternating current into a 12V direct current.

10. The power supply architecture according to claim 6, wherein the first copper bar is electrically connected to an outputting line via an electronic fuse board provided at a base-board-managing-controller board.

11. A power-supply shelf, wherein the power-supply shelf comprises:
- a power module, having a transformer, wherein the transformer is configured to convert a 220V alternating current from an inputting line into a 12V direct current;
- a base-board-managing-controller board, having an electronic fuse board, wherein the electronic fuse board is configured to transmit the 12V direct current with current limiting to an outputting line;
- at least one fan, wherein a wind exiting side of the fan faces a power-supply shelf where a heat dissipating and power supply module is located;
- a first copper bar of a U-shaped structure and half encircling the fan; and
- a second copper bar electrically connected to two ends of the first copper bar, wherein the first copper bar and the second copper bar combine to form a closed loop that fully encircles the fan.

12. The power-supply shelf according to claim 11, wherein the fan is a fan that does not have a Hall element.

13. The power-supply shelf according to claim 11, wherein the first copper bar is electrically connected to the inputting line on one side of the U-shaped structure, and electrically connected to the outputting line on the other side of the U-shaped structure; and
- the second copper bar diverts an electric current that flows from one side of the U-shaped structure to the other side.

14. The power-supply shelf according to claim 11, wherein the first copper bar is electrically connected to the inputting line via the transformer.

15. The power-supply shelf according to claim 11, wherein the first copper bar is electrically connected to the outputting line via the electronic fuse board.

16. A power supply architecture, wherein the power supply architecture comprises the power-supply shelf according to claim 11.

17. The power supply architecture according to claim 16, wherein the fan is a fan that does not have a Hall element.

18. The power supply architecture according to claim 16, wherein the first copper bar is electrically connected to the inputting line on one side of the U-shaped structure, and electrically connected to the outputting line on the other side of the U-shaped structure; and
- the second copper bar diverts an electric current that flows from one side of the U-shaped structure to the other side.

19. The power supply architecture according to claim 16, wherein the first copper bar is electrically connected to the inputting line via the transformer.

20. The power supply architecture according to claim 16, wherein the first copper bar is electrically connected to the outputting line via the electronic fuse board.

* * * * *